(12) United States Patent  (10) Patent No.: US 7,852,154 B2
Cooney  (45) Date of Patent: Dec. 14, 2010

(54) HIGH PRECISION FOLLOWER DEVICE WITH ZERO POWER, ZERO NOISE SLEW ENHANCEMENT CIRCUIT

(75) Inventor: Padraig Cooney, Somerville, MA (US)

(73) Assignee: Analog Devices, Inc., Norwood, MA (US)

( * ) Notice: Subject to any disclaimer, the term of this patent is extended or adjusted under 35 U.S.C. 154(b) by 24 days.

(21) Appl. No.: 12/390,916

(22) Filed: Feb. 23, 2009

(65) Prior Publication Data

US 2010/0214020 A1    Aug. 26, 2010

(51) Int. Cl.
*H03F 1/22*    (2006.01)
(52) U.S. Cl. ........................ 330/156; 330/311
(58) Field of Classification Search ............. 330/156, 330/290, 311
See application file for complete search history.

(56) References Cited

U.S. PATENT DOCUMENTS 4,484,147 A * 11/1984 Metz ........................ 330/156

* cited by examiner

*Primary Examiner*—Steven J Mottola
(74) *Attorney, Agent, or Firm*—Kenyon & Kenyon LLP

(57) ABSTRACT

A high performance follower device coupled with a slew enhancement circuit includes an amplifier circuit containing a follower device connected to a three-terminal device, whereupon current drawn through the three-terminal device is amplified through a current amplifier and sent to the source terminal of the follower device to stabilize the output voltage when the input signal is changed rapidly or if the output voltage is disturbed by a changing output load. The presence of a cascode device also allows for the bootstrapping of the follower device.

25 Claims, 2 Drawing Sheets

HIGH PRECISION FOLLOWER DEVICE WITH ZERO POWER, ZERO NOISE SLEW ENHANCEMENT CIRCUIT

FIELD OF THE INVENTION

The present invention particularly relates to the design of a slew enhancement circuit that stabilizes the output voltage of a follower device. The present invention further relates to a method of increasing the slew rate in a follower device.

BACKGROUND INFORMATION

In the design of precision circuits, the immunity of a circuit to the effects of non-linearity, noise, and common mode voltages tends to be a priority. In slower applications that require low power, these concerns can be alleviated easily. In many applications however, requirements for high speed and high precision are necessary and achieving this while maintaining low power is not readily obvious. This makes the implementation of devices such as a simple source follower more complex especially as one attempts to achieve a low power output.

Two types of common follower devices are source followers and emitter followers. A source follower is a configuration of a field-effect transistor ("FET"), whereupon an input signal is sent to the gate terminal of the FET, and the output is taken at the source terminal. In such a configuration, the drain of the FET is common to both the input and output. A load, such as a resistor or capacitor, is often connected to the source at the output. An emitter follower uses the same configuration, but instead of using a FET, a bipolar junction transistor ("BJT") is used, whereupon the input signal is sent to the base terminal of the BJT and the output is taken at the emitter terminal.

One of the predominant problems with follower devices is that if the input to the follower changes suddenly and the output is capacitively loaded, the output is unable to settle quickly. Furthermore, if the output is disturbed, it cannot settle back quickly if a large capacitor is connected as a load.

At low power levels, settling the output voltage is difficult because the follower's standing current is of low amperage and is insufficient to settle the output quickly. This may be addressed by attempting to increase the standing current itself, but doing so would result in a power increase to the circuit. Thus designing a circuit to increase the slew rate without increasing the power consumption or noise is essential.

Prior enhanced slew rate follower devices have included the use of additional transistors to achieve biasing of the follower, by stacking the transistors on top of the device. The limitation that these configurations have is that they implement additional devices that are always in an on-state. Though such proposed solutions might seemingly be suitable for low power applications, the presence of a continuously-on device ultimately leads to additional circuit noise. These configurations also compromise the common mode input voltage range because of the presence of additionally inserted circuit elements.

The present invention presents a configuration which allows for the enhancement of the slew rate while maintaining a lower power and high precision output. Furthermore, the present invention overcomes the problem of the additional noise associated with previous configurations, without compromising the input voltage range.

SUMMARY OF THE INVENTION

To address the above limitations of the prior art, the present invention provides a configuration of an amplifier circuit where a follower device has been coupled with a slew enhancement circuit in order to increase the slew rate of the follower while minimizing the power output. The present invention is also advantageous in that the configuration of the present invention allows for the reduction of noise and quick settling of the output voltage.

In the present invention, quiescent current is multiplied by a current amplifier when the output device's current drops below a set threshold, in order to create a current that can quickly stabilize the output voltage. Quiescent current, otherwise known as standing current, is important in high precision circuits because it is the current that is drawn from a circuit when the components in the circuit (transistors, etc.) are powered on, but are in a non-operating state. At low power, the quiescent current alone may not be enough to settle the output voltage fast enough and thus a multiplication of the current is needed.

The preferred embodiment is directed at a source follower an in an alternative embodiment, an emitter follower, however, the invention may be adapted for use with any device where a linear correlation between input and output is desired. The configuration of a source follower would be done using a metal-oxide-semiconductor field-effect transistor ("MOSFET") or a junction gate field-effect transistor ("JFET"). To implement an emitter follower, a BJT can be used. Regardless of whether the follower is a MOSFET, a JFET, or a BJT, the follower can be either an n-type follower (such as an "nMOS" device) shown in FIG. 1, or a p-type follower (such as a "pMOS" device) shown in FIG. 2.

The slew enhancement circuit contains a three-terminal transistor that is coupled to the follower and is turned on when the drain current of the follower device drops below a threshold set by the designer. Output current from the three-terminal transistor is sent through the current amplifier, where a significant current gain can be achieved. The current output from the current amplifier can be sent to the source of the follower (the emitter if a BJT is used), which allows for the voltage output of the source follower to settle quickly. The current amplifier is normally in the off-stage and only turns on when the follower device's current is too low. Because the current amplifier circuitry is in the off-stage in the quiescent state, no noise is produced at the output by the slew enhancement circuit.

The configuration also includes a cascode device, used to achieve more precise linear correlation of input and output, which can be coupled with the follower device. The purpose of the cascode device is to serve as a bootstrapping device to ensure that the follower gate-source voltage drop is constant and independent of an input signal. A current source can be coupled with the cascode device to be used as a current bias to turn on the three-terminal transistor in the enhancement circuit when the value of the drain current of the source follower is lower than the value of the current source.

The invention makes use of devices that are used to achieve precision, to facilitate the natural engagement of the slew enhancement when the circuit requires it, so that high speed and precision are complimentary features.

Further details and aspects of example embodiments of the present invention are described in more detail below with reference to the appended Figures.

DETAILED DESCRIPTION

The subject invention will now be described in detail for specific preferred embodiments of the invention, it being understood that these embodiments are intended only as illustrative examples and the invention is not to be limited thereto.

Figure 1:
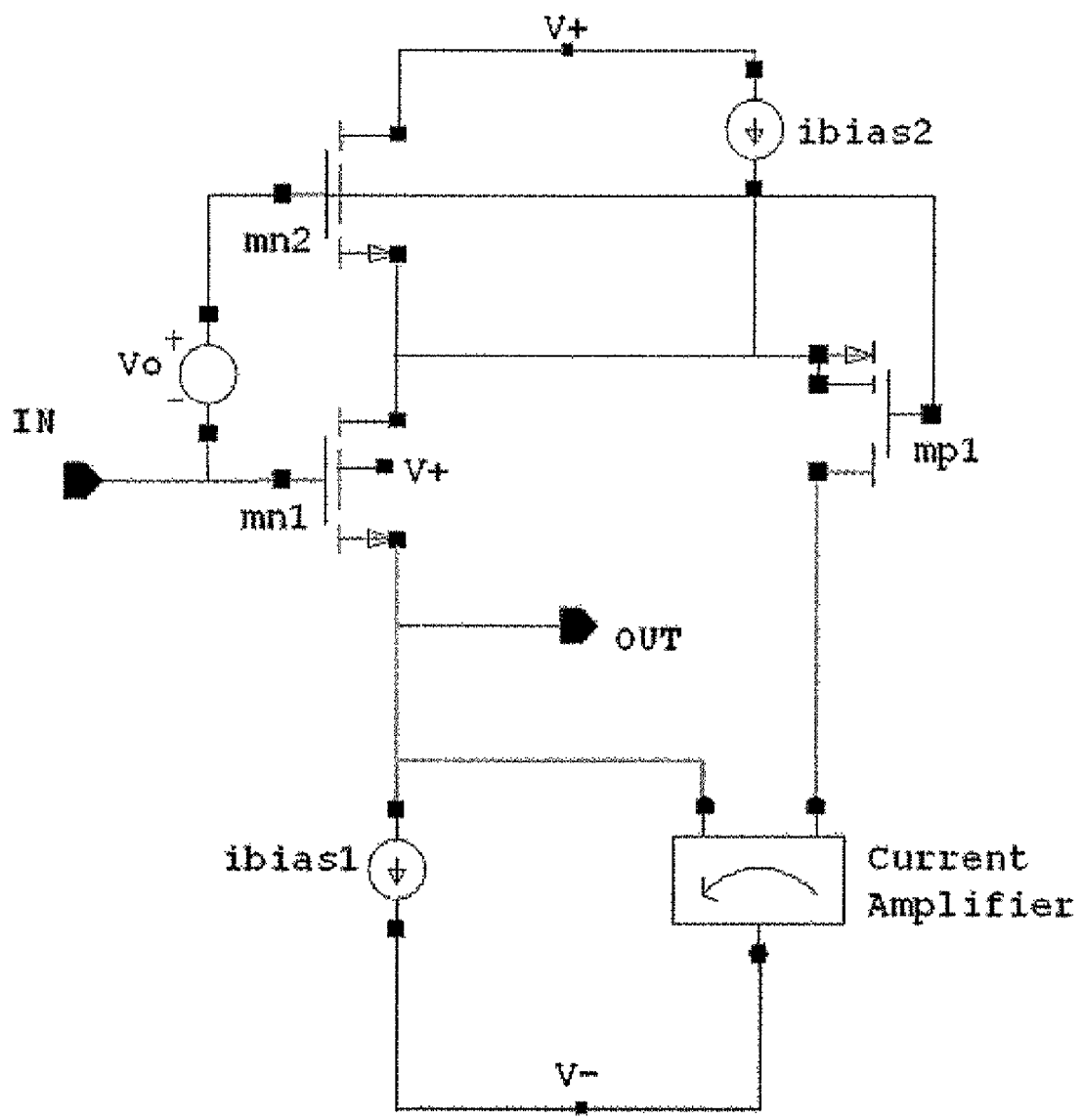
FIG. 1 is a circuit diagram of an n-type source follower with a slew enhancement circuit.
Figure 2:
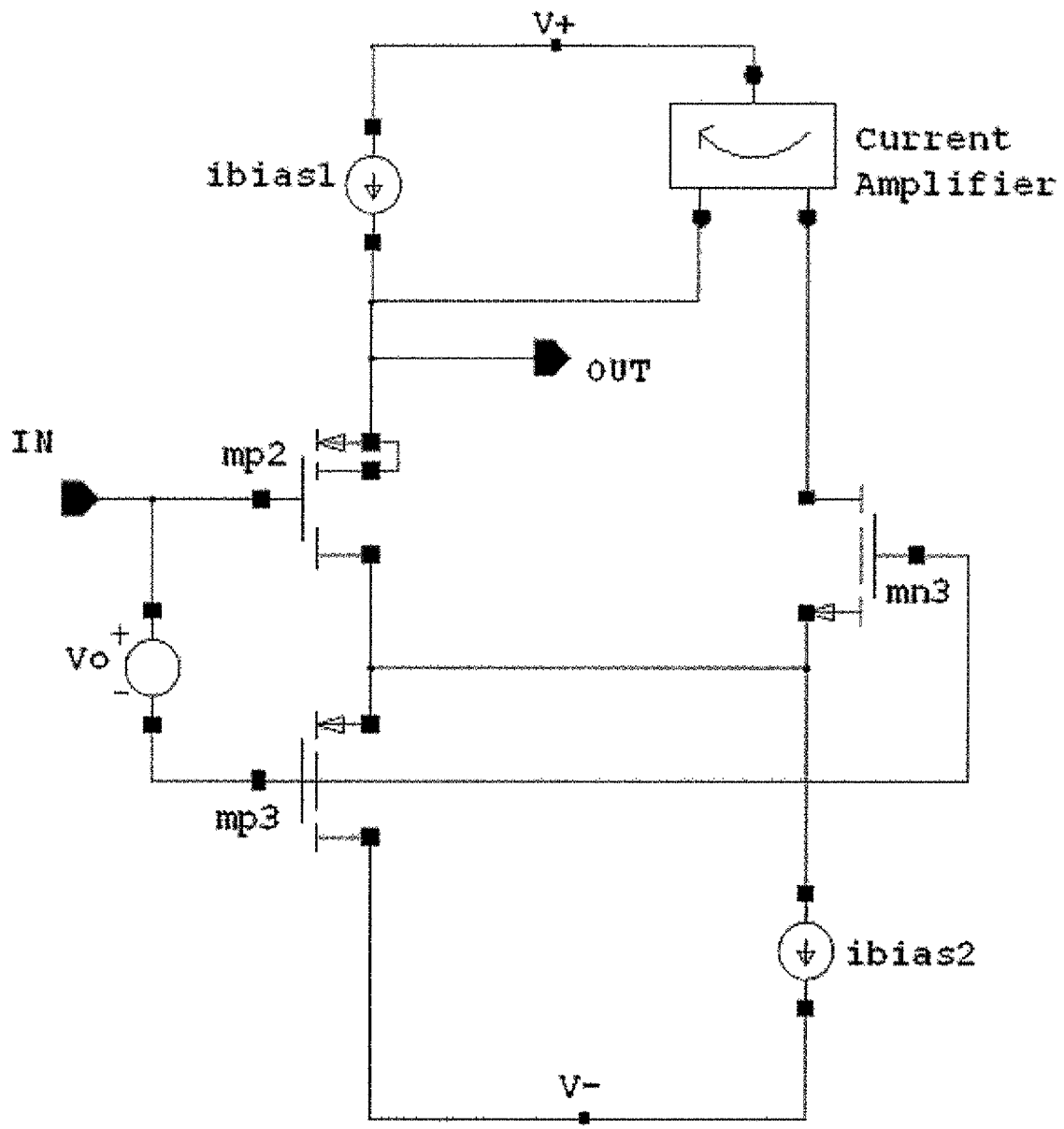
FIG. 2 is a circuit diagram of a p-type source follower with a slew enhancement circuit.

In the preferred embodiment, described herein, the follower device is selected to be source follower, which is shown in FIGS. 1 and 2. It should be understood that the present invention alternatively applies to configurations where an emitter follower is implemented or for use with any device where a linear correlation between input and output is desired.

FIG. 1 shows an embodiment of the present invention, with an n-type source follower connected to a slew enhancement circuit. The source follower, designated as mn1 in FIG. 1, can also be selected to be a p-type source follower, as is shown by mp2 in FIG. 2. The difference between an n-type follower and a p-type follower is the doping of the follower device, with an n-type follower signifying that a negative doping of the source follower has been achieved (whereas a p-type follower has been positively doped).

The preferred implementation of the source follower would be a MOSFET or a JFET. In FIG. 1, where an n-type source follower is configured, an nMOS device, an n-channel JFET, or a BJT may be used. In FIG. 2, where a p-type source follower is configured, either a pMOS or a p-channel JFET may be used. Because preferred embodiments of the present invention maintain the source follower device as a FET, the designations of the terminals of the device as the gate, drain, and source are the same regardless of the specific device used. In an alternative embodiment, where an emitter follower is used as a follower device, the emitter follower is implemented using a BJT, and can also be configured to be either an n-type or p-type follower. Under this alternative embodiment, the designation of the terminals of the follower device would be the base, collector and emitter.

In the preferred embodiment, a bias voltage $V_o$ is applied between the gate of the source follower and the gate of a cascode device shown in FIGS. 1 and 2. In an n-type source follower configuration, the drain of the source follower is connected to the cascode device, selected to be a FET, and the output is taken at the source of the follower. In a p-type follower configuration, the drain of the p-channel JFET or pMOS is connected to the cascode FET device. In an alternative embodiment, where an emitter follower is configured as the follower device, the cascode device is selected to be a BJT.

The purpose of the cascode device is to serve as a bootstrapping device to ensure that the follower device gate to source voltage is constant and independent of an input signal. This is shown by mn2 in FIG. 1.

The selection of the cascode device should mirror that of the source follower. If a nMOS or n-channel JFET is selected for the source follower, a similar nMOS or n-channel JFET is used for the cascode device. Similarly, if a pMOS or p-channel JFET is selected for the source follower, a pMOS or p-channel JFET is used for the cascode device. In an alternate embodiment where an emitter follower is configured, a BJT or another three-terminal transconductance device is selected for the cascode device.

In the preferred embodiment, a bias current source is coupled with the terminals of the cascode device, as shown by ibias2 in FIGS. 1 and 2. This current source is used as a current bias and turns on the three-terminal transistor in the enhancement circuit when the value of the drain current of the follower device is lower than the value of the current source.

The slew enhancement circuit contains a three-terminal transistor, mp1 in FIG. 1, which is coupled to the follower device and is turned on when the drain current of the follower drops below a threshold set by the designer. When the follower device drain current drops below the value of the current source ibias2, the three-terminal transistor clamps the gate-source voltage of the cascode device and passes the current from the current source to the current amplifier. Output current from the three-terminal transistor is then sent through a current amplifier, where a significant current gain can be achieved. The current output from the current amplifier is sent to the source of the follower, which allows for the voltage output of the follower device to settle quickly. In normal operation, the three-terminal transistor, acting as a current source, does not add to the power needed by the source follower nor does it contribute noise to the output.

In the preferred embodiment, the three-terminal transistor is selected to be a FET, as shown in FIGS. 1 and 2, though a BJT may be used in addition to a JFET or a MOSFET. In an embodiment where the three-terminal transistor is selected to be a FET and an n-type follower is configured, mp1 in FIG. 1, either a PMOS or a p-channel JFET is selected for the three-terminal transistor. Alternatively, in a p-type source follower configuration, as shown in FIG. 2, either a nMOS or an n-channel JFET may be used as a device. Selection of the three-terminal transistor to be a FET would also designate the terminals of the three-terminal transistor as the gate, source, and drain of the device.

The selection of the three-terminal transistor is not restricted to that of a FET device, and alternatively, a BJT or any three-terminal transconductance device can be selected in other embodiments. In an embodiment using BJTs, the selection of a NPN BJT over a PNP BJT is determined by whether an n-type source follower or a p-type source follower is used. If an n-type source follower is selected, a PNP BJT is selected for the three-terminal transistor. In a p-type source follower configuration, a NPN BJT is selected for the three-terminal transistor. The selection of a BJT or another transconductance device rather than a FET would change the designations of the terminals of the three-terminal transistor to the base, collector, and emitter.

In the preferred embodiment where the three-terminal transistor is selected to be a FET, the source of the threes terminal device is connected to the drain of the follower and the source of the cascode device in an n-type source follower configuration, as in FIG. 1. In a p-type source follower configuration, the source of the three-terminal device is similarly connected to the drain of the source follower and the source of the cascode device, as shown in FIG. 2.

Another biasing current source is connected to the source of the follower device. This biasing current source, ibias1, operates identically to ibias2, and assists in the proper operation of the follower.

A capacitor, which is not shown in FIGS. 1 and 2, is often used as a load at the output. When the input to the follower device suddenly decreases, the capacitor is not able to sufficiently discharge to settle the output voltage quickly. In the present invention, when the input voltage is suddenly decreased and the follower device is turned off, current flows from the three-terminal transistor through a current multiplier circuit (typically a current amplifier) to provide the necessary slew current to discharge the capacitor. This process works similarly for output disturbances caused by load changes where the output voltage also needs to be settled.

During a drop in the input signal, whereupon negative slewing occurs, an open loop condition is established until the follower device starts to turn on; because of the low value of the three-terminal transistor current source, the slew enhancement circuit is turned off shortly thereafter. Because the slew enhancement circuit components quickly turn off, a feedback loop is avoided, thus resulting in an open loop configuration where ringing that could be caused by components in the slew enhancement circuit is subsequently avoided.

After the slew enhancement circuit is turned off, the remainder of the output settling is determined by the linear settling behavior of the follower device by itself.

During periods in which there is no switching of the input signal and the output voltage is stable, both the three-terminal transistor and the current amplifier are in an off-state. This presents a significant advantage over previous attempts to increase the slew rate of a follower, in which coupled devices were constantly on.

The present invention also has the added advantage that neither the three-terminal transistor nor the current multiplier contribute any noise to the circuit, since the devices are generally off. The noise produced by the bias current source, ibias2, is absorbed by the cascode device, and thus doesn't affect the voltage output. The only noise sources within the circuit that affect the voltage output are the follower device itself, and its own biasing current source, ibias1.

What is claimed is:

1. An amplifier circuit, comprising:
   a follower device including a first three-terminal device, the first three-terminal device having a gate, a drain, and a source;
   a slew enhancement circuit including a second three-terminal device, and a current amplifier for increasing current to the follower device, wherein the second three-terminal device is coupled with the first three-terminal device, the second three-terminal device having a gate, a drain, and a source;
   a cascode device for bootstrapping the follower device, the cascode device coupled with the follower device and the slew enhancement circuit, the cascode device having a gate, a drain and a source;
   a power supply voltage having a positive and negative terminal; and
   a first current source that biases the first three-terminal device and is coupled with the first three-terminal device, the first current source having an input and an output terminal.

2. The amplifier circuit according to claim 1, wherein a second current source that biases the cascode device is coupled with the cascode device and the second three-terminal device, the second current source having an input and an output terminal.

3. The amplifier circuit according to claim 1, wherein the slew enhancement circuit is in the off-state when a constant voltage is applied to the gate of the first three-terminal device.

4. The amplifier circuit according to claim 1, wherein the follower device is an n-type follower.

5. The amplifier circuit according to claim 1, wherein the first three-terminal device is an n-type metal-oxide-semiconductor field-effect transistor ("nMOS"), a junction gate field-effect transistor ("JFET"), or a bipolar junction transistor ("BJT").

6. The amplifier circuit according to claim 1, wherein the drain of the first three-terminal device is connected to the source of the cascode device, the source of the cascode device being connected to the source of the second three-terminal device.

7. The amplifier circuit according to claim 1, wherein the source of the first three-terminal device is connected to the output terminal of the first current source, the input terminal of the first current source being connected to the negative terminal of the power supply voltage.

8. The amplifier circuit according to claim 1, wherein the source of the first three-terminal device is connected to the current amplifier, the current amplifier being connected to the drain of the second three-terminal device.

9. The amplifier circuit according to claim 2, wherein the source of the cascode device is connected to the output terminal of the second current source, the input terminal of the second current source being connected to the positive terminal of the power supply voltage.

10. The amplifier circuit according to claim 2, wherein the source of the cascode device is connected to the source of the second three-terminal device, the source of the second three-terminal device being connected to the output terminal of the second current source.

11. The amplifier circuit according to claim 1, wherein a DC voltage is applied between the gate of the cascode device and the gate of the first three-terminal device, the gate of the cascode device being connected to the gate of the second three-terminal device.

12. The amplifier circuit according to claim 1, wherein an input signal is applied to the gate of the first three-terminal device.

13. The amplifier circuit according to claim 1, wherein the cascode device is an n-type metal-oxide-semiconductor field-effect transistor ("nMOS"), a junction gate field-effect transistor ("JFET"), or a bipolar junction transistor ("BJT").

14. The amplifier circuit according to claim 1, wherein the second three-terminal device is a p-type metal-oxide-semiconductor field-effect transistor, a bipolar junction transistor, a pnp transistor, or a junction gate field-effect transistor.

15. The amplifier circuit according to claim 1, wherein the follower device is a p-type follower.

16. The amplifier circuit according to claim 15, wherein the first three-terminal device is a p-type metal-oxide-semiconductor field-effect transistor ("pMOS"), a junction gate field-effect transistor ("JFET"), or a bipolar junction transistor ("BJT").

17. The amplifier circuit according to claim 15, wherein the drain of the first three-terminal device is connected to the source of the cascode device, the source of the cascode device being connected to the source of the second three-terminal device.

18. The amplifier circuit according to claim 1, wherein the source of the first three-terminal device is connected to the output terminal of the first current source, the input terminal of the first current source being connected to the positive terminal of the power supply voltage.

19. The amplifier circuit according to claim 15, wherein the drain of the second three-terminal device is connected to the current amplifier, the current amplifier being connected to the source of the first three-terminal device.

20. The amplifier circuit according to claim 2, wherein the source of the cascode device is connected to the output terminal of the second current source, the input terminal of the second current source being connected to the negative terminal of the power supply voltage.

21. The amplifier circuit according to claim 2, wherein the source of the cascode device is connected to the source of the second three-terminal device, the source of the second three-terminal device being connected to the output of the second current source.

22. The amplifier circuit according to claim 15, wherein the cascode device is a p-type metal-oxide-semiconductor field-effect transistor ("pMOS"), a junction gate field-effect transistor ("JFET"), or a bipolar junction transistor ("BJT").

23. The amplifier circuit according to claim 15, wherein the second three-terminal device is an n-type metal-oxide-semiconductor field-effect transistor, a bipolar junction transistor, an npn transistor, or a junction gate field-effect transistor.

24. A method for enhancing the slew rate in a follower device, the method comprising:
- inputting a signal to a follower device, the signal being sent to a gate terminal of the follower device, the follower device having an output;
- bootstrapping the follower device by using a cascode device;
- biasing the follower device and the cascode device to enable functionality;
- diverting current through a slew enhancement circuit, the slew enhancement circuit having a three-terminal device and a current amplifier;
- multiplying diverted current through the current amplifier, sending current to the output of the follower device to settle voltage; and
- turning off the three-terminal device and the current amplifier when the signal to the follower device remains constant or current through the follower device is equal to a biasing current.

25. The amplifier circuit according to claim 1, wherein the slew enhancement circuit is in the off-state when the source of the first three-terminal device is undisturbed by an external load connected to the source of the first three-terminal device.

* * * * *